(12) United States Patent
Gangi et al.

(10) Patent No.: US 11,495,666 B2
(45) Date of Patent: Nov. 8, 2022

(54) SEMICONDUCTOR DEVICE

(71) Applicant: KABUSHIKI KAISHA TOSHIBA, Tokyo (JP)

(72) Inventors: Hiro Gangi, Ota (JP); Yusuke Kobayashi, Nagareyama (JP); Tomoaki Inokuchi, Yokohama (JP); Tatsunori Sakano, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 140 days.

(21) Appl. No.: 17/155,193

(22) Filed: Jan. 22, 2021

(65) Prior Publication Data

US 2021/0328027 A1 Oct. 21, 2021

(30) Foreign Application Priority Data

Apr. 15, 2020 (JP) .............................. JP2020-072762

(51) Int. Cl.
*H01L 29/40* (2006.01)
*H01L 29/78* (2006.01)

(52) U.S. Cl.
CPC .......... *H01L 29/404* (2013.01); *H01L 29/407* (2013.01); *H01L 29/7813* (2013.01)

(58) Field of Classification Search
CPC . H01L 29/404; H01L 29/407; H01L 29/7813; H01L 29/41766
USPC ....................................................... 257/330
See application file for complete search history.

(56) References Cited

U.S. PATENT DOCUMENTS

| 7,482,654 B2 * | 1/2009 | Cao ................... H01L 29/66666 257/341 |
| 8,198,678 B2 | 6/2012 | Mauder et al. |
| 9,716,152 B2 | 7/2017 | Nagata et al. |
| 9,917,183 B2 * | 3/2018 | Arai ...................... H01L 29/407 |
| 10,128,368 B2 * | 11/2018 | Li ..................... H01L 29/66734 |

(Continued)

FOREIGN PATENT DOCUMENTS

| CN | 113421921 A * | 9/2021 |
| JP | 2007-529115 A | 10/2007 |

(Continued)

*Primary Examiner* — Mohammad M Hoque
(74) *Attorney, Agent, or Firm* — Oblon, McClelland, Maier & Neustadt, L.L.P.

(57) ABSTRACT

According to one embodiment, a semiconductor device includes first, second, third semiconductor members, a first conductive member, a connection member, and an insulating member. The first electrode includes first, second, and third electrode regions. A direction from the first toward second electrode is along a first direction. The second electrode includes fourth, fifth, and sixth electrode regions. The first semiconductor member includes first, second, third, fourth, and fifth partial regions. The second semiconductor member includes first and second semiconductor regions. The third semiconductor member includes third and fourth semiconductor regions. The third electrode is provided between the third partial region and the sixth electrode region in the first direction. The connection member is electrically connected to the first conductive member and the second electrode. The insulating member includes first, second, third, fourth, and fifth portions. The fifth portion contacts the first semiconductor region and the connection member.

17 Claims, 7 Drawing Sheets

(56) References Cited

U.S. PATENT DOCUMENTS

| | | | |
|---|---|---|---|
| 10,707,343 B2* | 7/2020 | Ohtani | H01L 29/063 |
| 2003/0001202 A1* | 1/2003 | Kitamura | H01L 29/1083 |
| | | | 257/E29.268 |
| 2006/0255401 A1 | 11/2006 | Yang et al. | |
| 2007/0012983 A1 | 1/2007 | Yang et al. | |
| 2007/0210356 A1* | 9/2007 | Henson | H01L 29/7813 |
| | | | 257/E29.066 |
| 2008/0197407 A1 | 8/2008 | Challa et al. | |
| 2010/0219468 A1* | 9/2010 | Zeng | H01L 29/1079 |
| | | | 257/330 |
| 2012/0199899 A1* | 8/2012 | Kobayashi | H01L 29/66734 |
| | | | 438/270 |
| 2013/0062688 A1 | 3/2013 | Kobayashi | |
| 2015/0084121 A1* | 3/2015 | Siemieniec | H01L 29/66727 |
| | | | 438/270 |
| 2021/0328027 A1* | 10/2021 | Gangi | H01L 29/7813 |

FOREIGN PATENT DOCUMENTS

| | | |
|---|---|---|
| JP | 2013-62344 A | 4/2013 |
| JP | 2014-78741 A | 5/2014 |
| JP | 2017-45776 A | 3/2017 |

* cited by examiner

… (1) …

SEMICONDUCTOR DEVICE

CROSS-REFERENCE TO RELATED APPLICATIONS

This application is based upon and claims the benefit of priority from Japanese Patent Application No. 2020-072762, filed on Apr. 15, 2020; the entire contents of which are incorporated herein by reference.

FIELD

Embodiments of the invention generally relate to a semiconductor device.

BACKGROUND

It is desirable to improve the characteristics of a semiconductor device.

DETAILED DESCRIPTION

Figure 1:
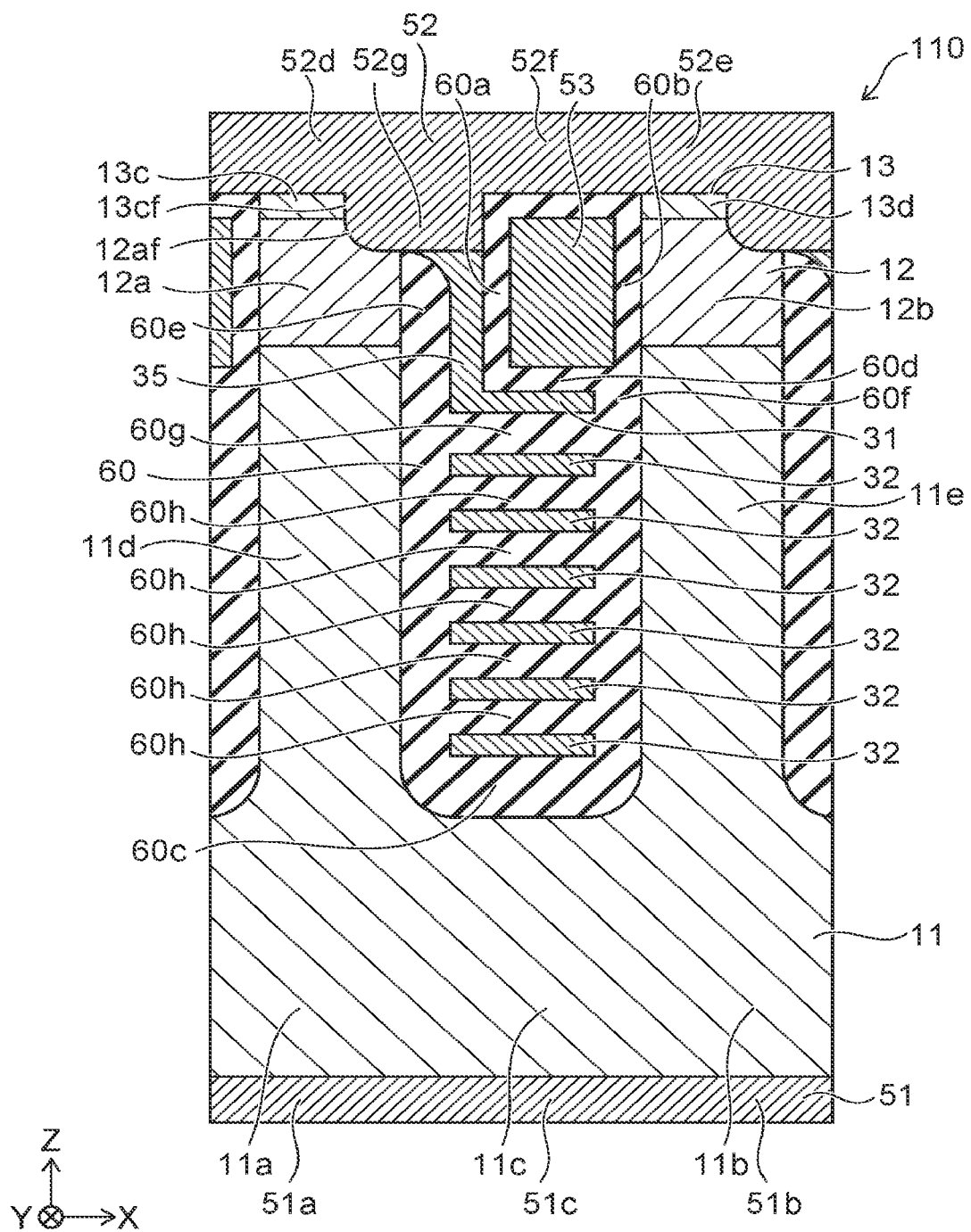
FIG. 1 is a schematic cross-sectional view illustrating a semiconductor device according to a first embodiment.

According to one embodiment, a semiconductor device includes a first electrode, a second electrode, a first semiconductor member, a second semiconductor member, a third semiconductor member, a third electrode, a first conductive member, a connection member, and an insulating member. The first electrode includes a first electrode region, a second electrode region, and a third electrode region. A direction from the first electrode toward the second electrode is along a first direction. A direction from the first electrode region toward the second electrode region is along a second direction crossing the first direction. The third electrode region is between the first electrode region and the second electrode region. The second electrode includes a fourth electrode region, a fifth electrode region, and a sixth electrode region. A direction from the first electrode region toward the fourth electrode region is along the first direction. A direction from the second electrode region toward the fifth electrode region is along the first direction. A direction from the third electrode region toward the sixth electrode region is along the first direction. The first semiconductor member includes a first partial region, a second partial region, a third partial region, a fourth partial region, and a fifth partial region. The first semiconductor member is of a first conductivity type. The first partial region is between the first electrode region and the fourth electrode region in the first direction. The second partial region is between the second electrode region and the fifth electrode region in the first direction. The third partial region is between the third electrode region and the sixth electrode region in the first direction. The fourth partial region is between the first partial region and the fourth electrode region in the first direction. The fifth partial region is between the second partial region and the fifth electrode region in the first direction. The second semiconductor member includes a first semiconductor region and a second semiconductor region. The second semiconductor member is of a second conductivity type. The first semiconductor region is between the fourth partial region and the fourth electrode region in the first direction. The second semiconductor region is between the fifth partial region and the fifth electrode region in the first direction. The third semiconductor member includes a third semiconductor region and a fourth semiconductor region. The third semiconductor member is of the first conductivity type. The third semiconductor region is between the first semiconductor region and the fourth electrode region in the first direction. The fourth semiconductor region is between the second semiconductor region and the fifth electrode region in the first direction. The third electrode is provided between the third partial region and the sixth electrode region in the first direction. At least a portion of the third electrode is between the first semiconductor region and the second semiconductor region and between the third semiconductor region and the fourth semiconductor region. At least a portion of the first conductive member is between the third partial region and the third electrode in the first direction and between the fourth partial region and the fifth partial region in the second direction. The connection member is electrically connected to the first conductive member and the second electrode. At least a portion of the connection member is between the first semiconductor region and the third electrode. The insulating member includes a first portion, a second portion, a third portion, a fourth portion, and a fifth portion. The first portion is between the connection member and the third electrode. The second portion is between the third electrode and the second semiconductor region. The third portion is between the first partial region and the first conductive member. The fourth portion is between the first conductive member and the third electrode. The fifth portion is between the first semiconductor region and the connection member. The fifth portion contacts the first semiconductor region and the connection member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first semiconductor member 11, a second semiconductor member 12, a third semiconductor member 13, a first conductive member 31, a connection member 35, and an insulating member 60.

The first electrode 51 includes a first electrode region 51a, a second electrode region 51b, and a third electrode region 51c. The direction from the first electrode 51 toward the second electrode 52 is along a first direction.

The first direction is taken as a Z-axis direction. A direction perpendicular to the Z-axis direction is taken as an X-axis direction. A direction perpendicular to the Z-axis direction and the X-axis direction is taken as a Y-axis direction.

In the first electrode 51, the direction from the first electrode region 51a toward the second electrode region 51b is along a second direction. The second direction crosses the first direction (the Z-axis direction). The second direction is, for example, the X-axis direction. The third electrode region 51c is between the first electrode region 51a and the second electrode region 51b.

The second electrode 52 includes a fourth electrode region 52d, a fifth electrode region 52e, and a sixth electrode region 52f. The direction from the first electrode region 51a toward the fourth electrode region 52d is along the first direction (the Z-axis direction). The direction from the second electrode region 51b toward the fifth electrode region 52e is along the first direction. The direction from the third electrode region 51c toward the sixth electrode region 52f is along the first direction. The sixth electrode region 52f is between the fourth electrode region 52d and the fifth electrode region 52e in the second direction (e.g., the X-axis direction).

The first semiconductor member 11 includes a first partial region 11a, a second partial region 11b, a third partial region 11c, a fourth partial region 11d, and a fifth partial region 11e. The first semiconductor member 11 is of a first conductivity type. The first partial region 11a is between the first electrode region 51a and the fourth electrode region 52d in the first direction (the Z-axis direction). The second partial region 11b is between the second electrode region 51b and the fifth electrode region 52e in the first direction (the Z-axis direction). The third partial region 11c is between the third electrode region 51c and the sixth electrode region 52f in the first direction (the Z-axis direction). The fourth partial region 11d is between the first partial region 11a and the fourth electrode region 52d in the first direction (the Z-axis direction). The fifth partial region 11e is between the second partial region 11b and the fifth electrode region 52e in the first direction (the Z-axis direction).

The second semiconductor member 12 includes a first semiconductor region 12a and a second semiconductor region 12b. The second semiconductor member 12 is of a second conductivity type.

In the embodiment, the first conductivity type is one of an n-type or a p-type. The second conductivity type is the other of the n-type or the p-type. Hereinbelow, the first conductivity type is taken to be the n-type, and the second conductivity type is taken to be the p-type. For example, the first semiconductor member 11 is an n-type layer. For example, the second semiconductor member 12 is a p-type layer.

The first semiconductor region 12a between the fourth partial region 11d and the fourth electrode region 52d in the first direction (the Z-axis direction). The second semiconductor region 12b is between the fifth partial region 11e and the fifth electrode region 52e in the first direction (the Z-axis direction).

The third semiconductor member 13 includes a third semiconductor region 13c and a fourth semiconductor region 13d. The third semiconductor member 13 is of the first conductivity type. For example, the third semiconductor member 13 is an n-type layer. The third semiconductor region 13c is between the first semiconductor region 12a and the fourth electrode region 52d in the first direction (the Z-axis direction). The fourth semiconductor region 13d is between the second semiconductor region 12b and the fifth electrode region 52e in the first direction (the Z-axis direction).

The third electrode 53 is provided between the third partial region 11c and the sixth electrode region 52f in the first direction (the Z-axis direction). In the second direction (the X-axis direction), at least a portion of the third electrode 53 is between the first semiconductor region 12a and the second semiconductor region 12b and between the third semiconductor region 13c and the fourth semiconductor region 13d.

At least a portion of the first conductive member 31 is between the third partial region 11c and the third electrode 53 in the first direction (the Z-axis direction) and between the fourth partial region 11d and the fifth partial region 11e in the second direction (the X-axis direction).

The connection member 35 electrically connects the first conductive member 31 and the second electrode 52. At least a portion of the connection member 35 is between the first semiconductor region 12a and the third electrode 53 in the second direction (the X-axis direction). The boundary between the connection member 35 and the first conductive member 31 may be distinct or indistinct. The boundary between the connection member 35 and the second electrode 52 may be distinct or indistinct. The connection member 35 and the first conductive member 31 may include the same material or different materials.

The insulating member 60 includes a first portion 60a, a second portion 60b, a third portion 60c, a fourth portion 60d, and a fifth portion 60e. The first portion 60a is between the connection member 35 and the third electrode 53. The second portion 60b is between the third electrode 53 and the second semiconductor region 12b. The third portion 60c is between the third partial region 11c and the first conductive member 31. The fourth portion 60d is between the first conductive member 31 and the third electrode 53. The fifth portion 60e is between the first semiconductor region 12a and the connection member 35. For example, the fifth portion 60e contacts the first semiconductor region 12a and the connection member 35.

The insulating member 60 electrically insulates between the connection member 35 and the third electrode 53. The insulating member 60 electrically insulates between the first conductive member 31 and the third electrode 53. The insulating member 60 electrically insulates between the first semiconductor member 11 and the third electrode 53. The insulating member 60 electrically insulates between the second semiconductor member 12 and the third electrode 53. The insulating member 60 electrically insulates between the third semiconductor member 13 and the third electrode 53.

For example, the first electrode 51 functions as a drain electrode. For example, the second electrode 52 functions as a source electrode. For example, the third electrode 53 functions as a gate electrode. For example, the first conductive member 31 functions as a field plate. The semiconductor device 110 is, for example, a transistor.

By providing the first conductive member 31, for example, local concentration of the electric field can be suppressed. Stable characteristics are obtained thereby. For example, a high breakdown voltage is obtained. For example, high reliability is obtained.

There is a first reference example in which two gate electrodes are provided in one trench. In the first reference example, a connection member that is connected to a field plate is between the two gate electrodes. In the first reference example, it is difficult to reduce the width of the trench because the two gate electrodes and the connection member are provided in the one trench.

For example, in a second reference example, a connection conductive member that connects the second electrode 52 and a p-type layer (e.g., the second semiconductor member 12) is provided between multiple trenches. In the second reference example, it is difficult to reduce the distance (the distance along the X-axis direction) between the multiple trenches because the connection conductive member is provided.

In the embodiment, for example, one third electrode 53 and one connection member 35 are provided in one trench. Compared to the first reference example, the width of the trench is easily reduced in the embodiment. Thereby, the surface area of the carrier region per unit area can be greater than that of the first reference example. For example, the on-resistance is easily reduced thereby.

In the embodiment, the connection member 35 electrically connects the second electrode 52 and a p-type layer (the second semiconductor member 12). For example, the connection conductive member of the second reference example can be omitted. Thereby, the surface area of the carrier region per unit area can be high compared to the second reference example. The on-resistance is easily reduced thereby. For example, when multiple trenches are provided as described below, compared to the second reference example, the spacing between the multiple trenches is easily reduced. For example, the on-resistance is easily reduced thereby.

In the semiconductor device 110, the first conductive member 31 is electrically connected to the second electrode 52 by the connection member 35. The connection member 35 is between the first semiconductor region 12a and the third electrode 53. As described below, the connection member 35 can extend along the Y-axis direction. The electrical resistances of the connection member 35 and the first conductive member 31 can be reduced thereby. For example, a charge can be quickly supplied to the first conductive member 31 and a conductive layer 32. For example, a breakdown voltage decrease at turn-off can be suppressed thereby. A semiconductor device can be provided in which the characteristics can be improved.

In the example as shown in FIG. 1, the semiconductor device 110 includes the conductive layer 32. The conductive layer 32 is between the third portion 60c and the first conductive member 31 in the first direction (the Z-axis direction).

The insulating member 60 includes a seventh portion 60g. The seventh portion 60g is between the conductive layer 32 and the first conductive member 31. For example, the potential of the conductive layer 32 is floating. The local concentration of the electric field can be further suppressed by providing the conductive layer 32. More stable characteristics are obtained. The breakdown voltage can be increased.

Multiple conductive layers 32 are provided in the example. The multiple conductive layers 32 are arranged along the first direction (the Z-axis direction). The insulating member 60 includes an eighth portion 60h. The eighth portion 60h is between the multiple conductive layers 32. For example, the multiple conductive layers 32 are capacitively coupled to each other. The multiple conductive layers 32 are capacitively coupled with the first conductive member 31. By providing the multiple conductive layers 32, the local concentration of the electric field can be further suppressed. More stable characteristics are obtained. The breakdown voltage can be increased. A semiconductor device can be provided in which the characteristics can be improved.

Figure 2:
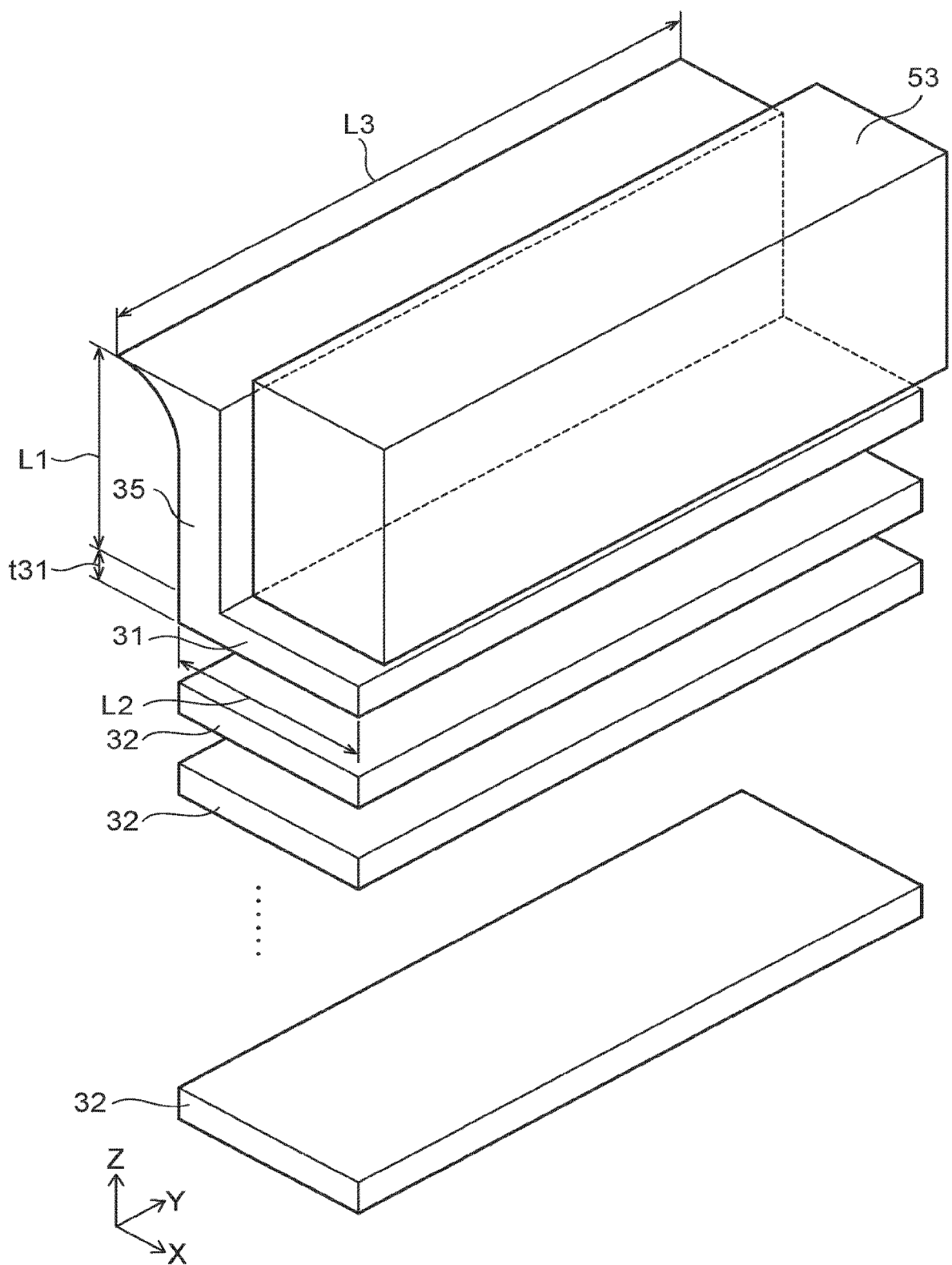
FIG. 2 is a schematic perspective view illustrating the semiconductor device according to the first embodiment.

FIG. 2 is a schematic perspective view illustrating the semiconductor device according to the first embodiment.

FIG. 2 illustrates the first conductive member 31, the multiple conductive layers 32, and the third electrode 53. The insulating member 60 is not illustrated in FIG. 2.

As shown in FIG. 2, the first conductive member 31, the multiple conductive layers 32, and the third electrode 53 extend along a third direction. The third direction crosses a plane including the first and second directions. The third direction is, for example, the Y-axis direction.

The connection member 35 also extends along the third direction (e.g., the Y-axis direction). For example, the length along the third direction (the Y-axis direction) of the connection member 35 is taken as a length L3. The length along the first direction (the Z-axis direction) of the connection member 35 is taken as a length L1. The length L3 is greater than the length L1. By providing such a connection member 35 along the first conductive member 31, the electrical resistance of the connection member 35 is reduced. For example, the first conductive member 31 is electrically connected to the second electrode 52 with low electrical resistance. The potential of the first conductive member 31 is more stable.

As shown in FIG. 2, a length L2 along the X-axis direction of the first conductive member 31 is greater than a length t31 along the Z-axis direction of the first conductive member 31. The first conductive member 31 is layer-shaped. The electrical resistance of the first conductive member 31 can be low.

As shown in FIG. 1, the second electrode 52 may further include a seventh electrode region 52g. A portion of the seventh electrode region 52g is between the first semiconductor region 12a and the first portion 60a in the second direction (the X-axis direction). Another portion of the seventh electrode region 52g is between the third semiconductor region 13c and a portion of the third electrode 53 in the second direction (the X-axis direction). Another portion of the seventh electrode region 52g is between the first portion 60a and a portion of the third electrode 53 in the second direction (the X-axis direction).

The portion of the seventh electrode region 52g described above contacts the first semiconductor region 12a. The other portion of the seventh electrode region 52g described above contacts the third semiconductor region 13c. The second electrode 52 can be stably electrically connected to the first and third semiconductor regions 12a and 13c.

For example, a portion of the first semiconductor region 12a is between the fourth partial region 11d and the seventh electrode region 52g in the first direction (the Z-axis direction). For example, the first semiconductor region 12a includes a first surface 12af facing the seventh electrode region 52g. For example, the first surface 12af contacts the seventh electrode region 52g. For example, a hole flow due to an avalanche phenomenon occurring in the fourth partial region 11d can be quickly ejected to the first surface 12af. For example, when the hole flow cannot be quickly ejected, the potential of the first surface 12af becomes high, and loss occurs due to a current flowing through a parasitic bipolar transistor. Conversely, in the embodiment, the potential of the first surface 12af can be prevented from becoming high because the hole flow can be quickly ejected via the first surface 12af. The loss can be suppressed thereby.

The first surface 12af may be oblique to the first direction (the Z-axis direction) and the second direction (the X-axis direction). The contact area can be large, and the electrical resistance of the contact can be small. Good coverage at the seventh electrode region 52g is easily obtained.

For example, the third semiconductor region 13c includes a third surface 13cf facing the seventh electrode region 52g. The third surface 13cf may be oblique to the first direction (the Z-axis direction) and the second direction (the X-axis direction). The contact area can be large, and the electrical resistance of the contact can be small. Good coverage at the seventh electrode region 52g is easily obtained.

As shown in FIG. 1, the insulating member 60 may include a sixth portion 60f. The sixth portion 60f is between the first conductive member 31 and the fifth partial region 11e. The direction from the sixth portion 60f toward a portion of the third electrode 53 is along the first direction (the Z-axis direction). For example, the position of the first conductive member 31 in the X-axis direction (e.g., the position of the X-axis direction center) is shifted from the position of the third electrode 53 in the X-axis direction (e.g., the position of the X-axis direction center). By such a configuration, the third electrode 53 can be positioned above a portion of the first conductive member 31, and the connection member 35 can be positioned above another portion of the first conductive member 31. Stable insulation is obtained by providing the sixth portion 60f such as that described above in the insulating member 60.

In the embodiment as described above, the first conductive member 31 is electrically connected to the second electrode 52 with a low electrical resistance. The potential of the first conductive member 31 is stabilized thereby. When the electrical resistance of the connection between the first conductive member 31 and the second electrode 52 is low, compared to when the electrical resistance is high, the nonuniformity of the capacitive coupling of the multiple conductive layers 32 greatly affects the uniformity of the electric field. In the embodiment, the following configuration is applicable. The uniformity of the electric field based on the capacitive coupling can be further increased thereby.

Figure 3:
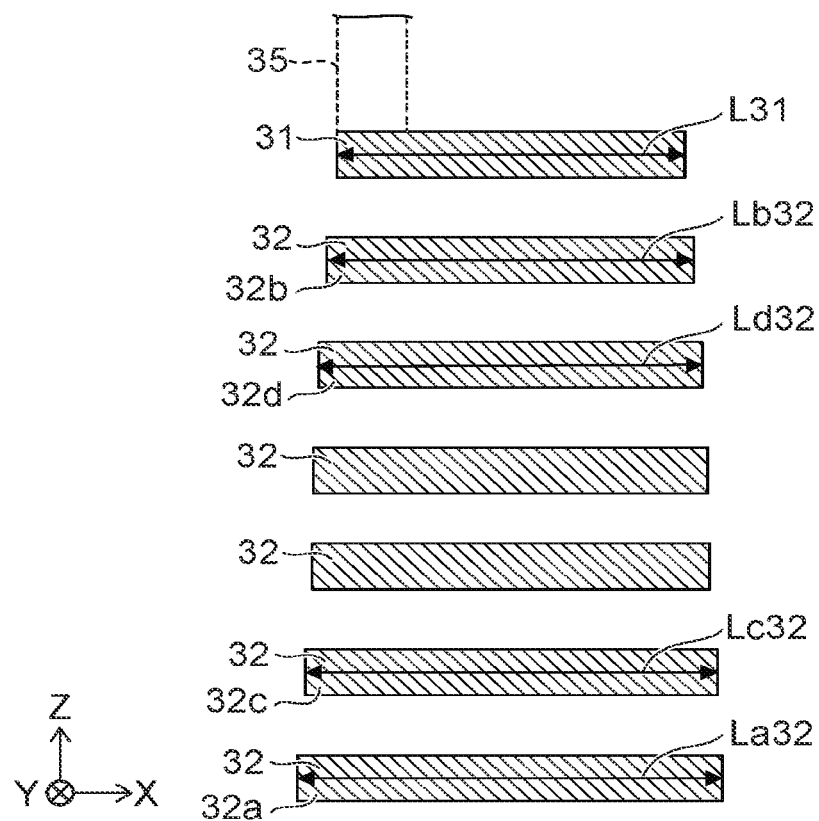
FIG. 3 is a schematic cross-sectional view illustrating a portion of the semiconductor device according to the first embodiment.
Figure 4:
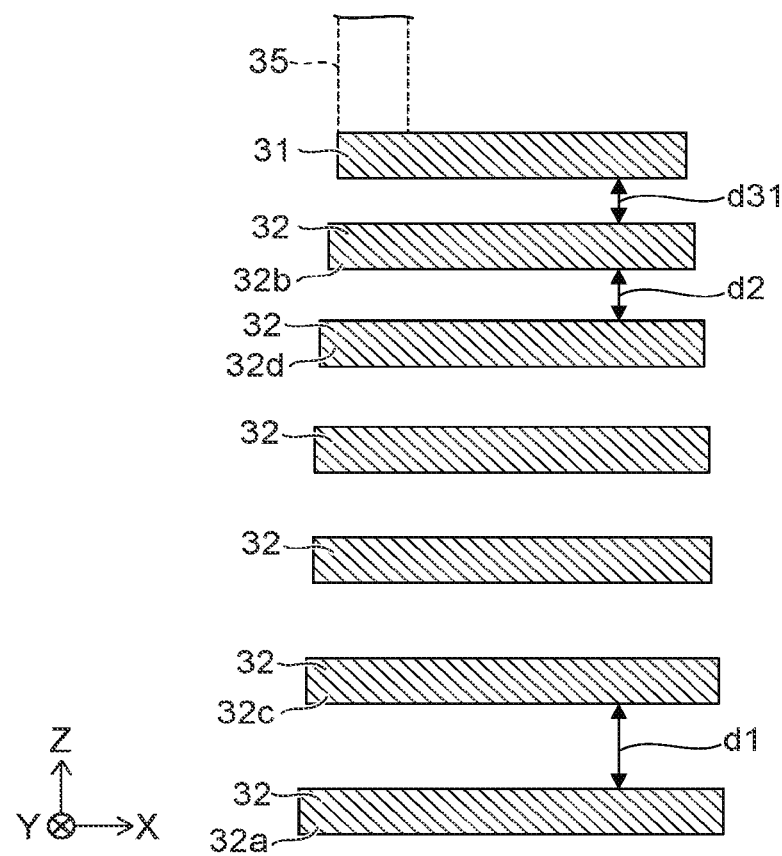
FIG. 4 is a schematic cross-sectional view illustrating a portion of the semiconductor device according to the first embodiment.

FIGS. 3 and 4 are schematic cross-sectional views illustrating a portion of the semiconductor device according to the first embodiment.

As shown in FIG. 3, the multiple conductive layers 32 include a first conductive layer 32a and a second conductive layer 32b. The second conductive layer 32b is between the first conductive layer 32a and the first conductive member 31. A length La32 along the second direction (the X-axis direction) of the first conductive layer 32a is greater than a length Lb32 along the second direction of the second conductive layer 32b.

The multiple conductive layers 32 further include a third conductive layer 32c. The third conductive layer 32c is between the first conductive layer 32a and the second conductive layer 32b. A length Lc32 along the second direction (the X-axis direction) of the third conductive layer 32c is between the length La32 along the second direction of the first conductive layer 32a and the length Lb32 along the second direction of the second conductive layer 32b.

The multiple conductive layers 32 may further include a fourth conductive layer 32d. The fourth conductive layer 32d is between the third conductive layer 32c and the second conductive layer 32b. The third conductive layer 32c is next to the first conductive layer 32a. The fourth conductive layer 32d is next to the second conductive layer 32b. A length Ld32 along the second direction (the X-axis direction) of the fourth conductive layer 32d is between the length Lc32 along the second direction of the third conductive layer 32c and the length Lb32 along the second direction of the second conductive layer 32b.

Thus, for example, the lengths along the X-axis direction of the multiple conductive layers 32 may decrease toward the first conductive member 31. By such a configuration, the multiple conductive layers 32 are easier to manufacture. For example, the structure that includes the multiple conductive layers 32 can be made by alternately and repeatedly forming a conductive film used to form the conductive layer 32 and a film used to form the eighth portion 60h. In such a case, the lengths in the X-axis direction of the multiple conductive layers 32 decrease toward the first conductive member 31 because the films that are used to form the eighth portions 60h are repeatedly made.

In such a case, for example, the facing area between the first conductive layer 32a and the third conductive layer 32c is greater than the facing area between the fourth conductive layer 32d and the second conductive layer 32b. The surface area difference becomes the electrical capacitance difference. As described below, the electrical capacitance difference can be reduced by adjusting the distance between the multiple conductive layers 32.

As shown in FIG. 4, for example, a distance d1 along the first direction (the Z-axis direction) between the first conductive layer 32a and the third conductive layer 32c may be greater than a distance d2 along the first direction between the fourth conductive layer 32d and the second conductive layer 32b. The electrical capacitance difference can be suppressed by providing such a distance difference.

The fourth conductive layer 32d may be considered to be the third conductive layer 32c when the number of the multiple conductive layers 32 is three.

As shown in FIG. 3, a length L31 in the X-axis direction of the first conductive member 31 may be less than the lengths (e.g., the lengths Lb32) in the X-axis direction of the multiple conductive layers 32.

For example, the second conductive layer 32b is most proximate to the first conductive member 31 among the multiple conductive layers 32. The second conductive layer 32b is next to the first conductive member 31. As shown in FIG. 4, a distance d31 along the Z-axis direction between the second conductive layer 32b and the first conductive member 31 may be less than the distance d2. The uniformity of the relaxation of the electric field due to the capacitive coupling is further increased.

The impurity concentration (or the carrier concentration) of the first conductivity type in the third semiconductor member 13 is greater than the impurity concentration (or the carrier concentration) of the first conductivity type in the first semiconductor member 11. The third semiconductor member 13 is, for example, an $n^+$-region. The first semiconductor member 11 is, for example, an $n^-$-region. The second semiconductor member 12 is, for example, a $p^-$-region.

These semiconductor regions may include, for example, silicon, germanium, a silicon germanium compound, silicon carbide, a compound semiconductor (e.g., a nitride semiconductor such as GaN, etc.), etc.

The first electrode 51 and the second electrode 52 include, for example, at least one selected from the group consisting of aluminum and tungsten. The third electrode 53, the first conductive member 31, and the multiple conductive layers 32 include, for example, polysilicon, etc. The insulating member 60 includes, for example, an element including at least one selected from the group consisting of silicon and aluminum and an element including at least one selected from the group consisting of oxygen and nitrogen. The insulating member 60 includes, for example, silicon oxide.

Figure 5:
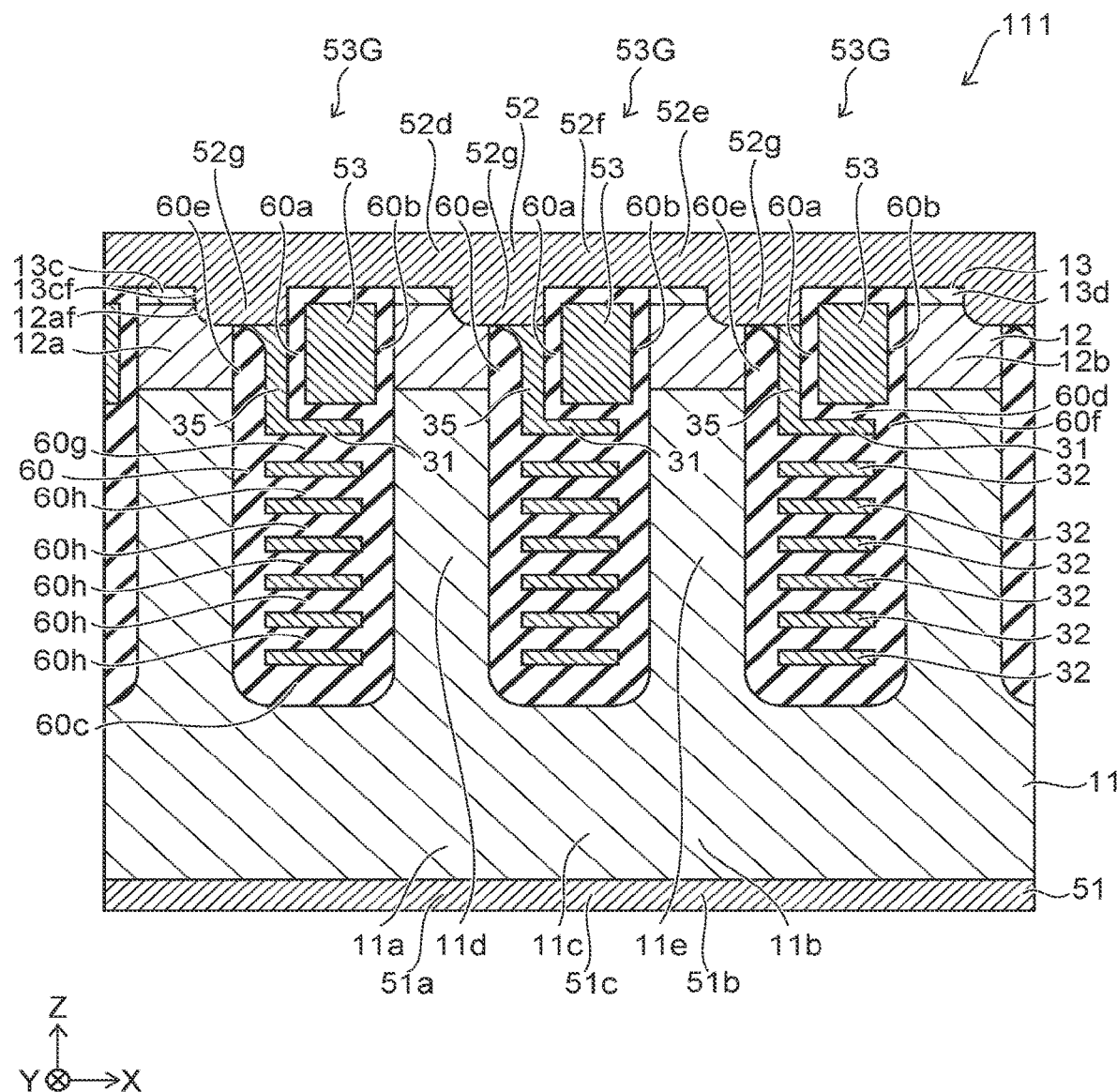
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, multiple structure bodies 53G are provided in the semiconductor device 111. One of the multiple structure bodies 53G includes the third electrode 53, the first conductive member 31, and the connection member 35. The multiple structure bodies 53G are arranged in the X-axis direction. One of the multiple structure bodies 53G corresponds to one trench region.

In the semiconductor device 111, the length along the X-axis direction of one of the multiple structure bodies 53G is easily reduced. For example, the distance (the width) along the X-axis direction of the region between the multiple structure bodies 53G is easily reduced. The surface area of the carrier region per unit area is easily increased. A low on-resistance is easily obtained thereby.

Second Embodiment

Figure 6:
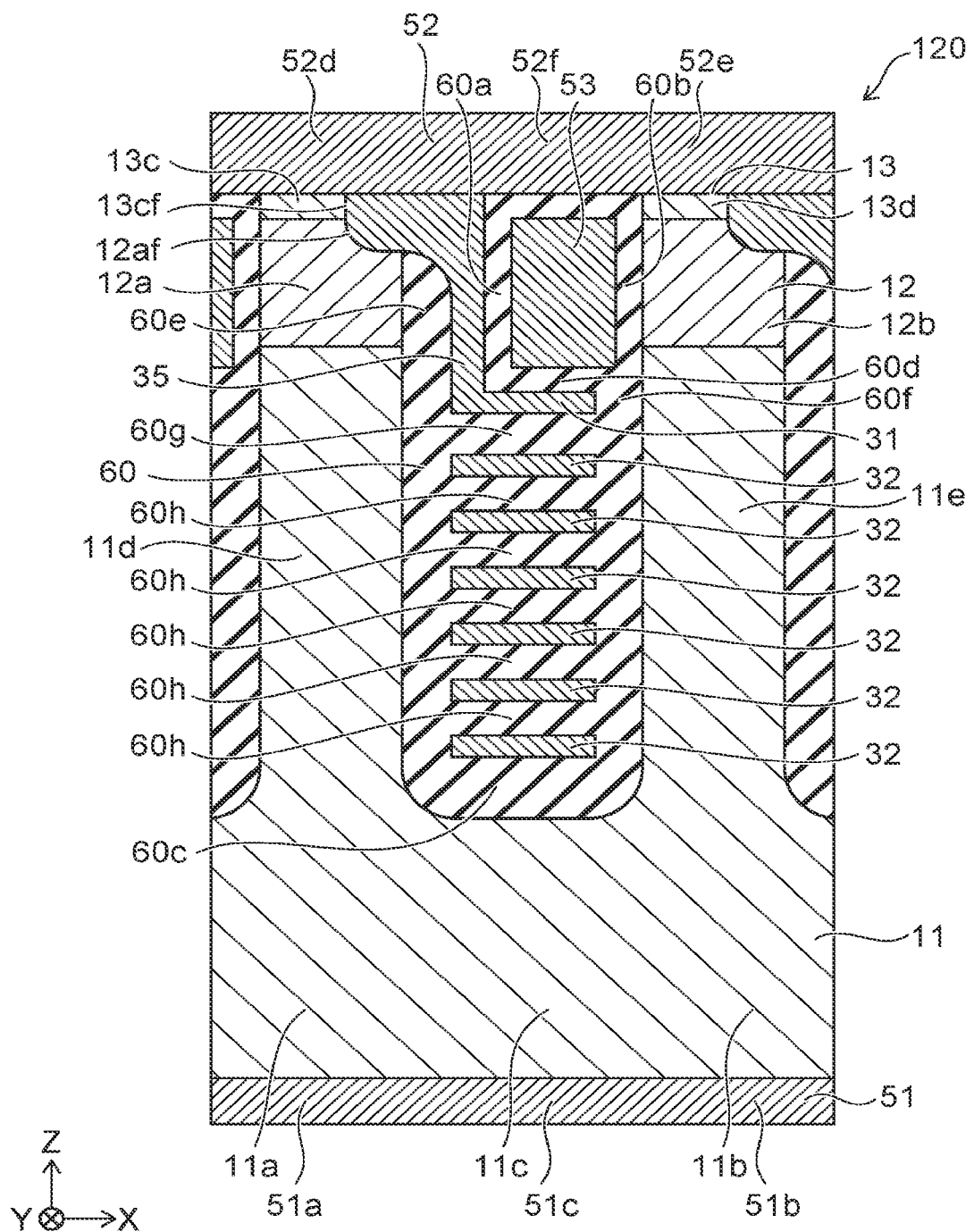
FIG. 6 is a schematic cross-sectional view illustrating a semiconductor device according to a second embodiment.

FIG. 6 is a schematic cross-sectional view illustrating a semiconductor device according to a second embodiment.

As shown in FIG. 6, the semiconductor device 120 according to the embodiment includes the first electrode 51, the second electrode 52, the third electrode 53, the first semiconductor member 11, the second semiconductor member 12, the third semiconductor member 13, the first conductive member 31, the connection member 35, and the insulating member 60. The configuration of the connection member 35 of the semiconductor device 120 is different from the configuration of the connection member 35 of the semiconductor device 110. Otherwise, the configuration of the semiconductor device 120 may be similar to the configuration of the semiconductor device 110. An example of the connection member 35 of the semiconductor device 120 will now be described.

As shown in FIG. 6, a portion of the connection member 35 is between the first semiconductor region 12a and the first portion 60a. Another portion of the connection member 35 is between the third semiconductor region 13c and a portion of the third electrode 53. The portion of the connection member 35 described above contacts the first semiconductor region 12a. The other portion of the connection member 35 described above contacts the third semiconductor region 13c. The insulating member 60 contacts the connection member 35 and the third electrode 53. The second portion 60b of the insulating member 60 contacts the third electrode 53 and the second semiconductor region 12b. In such a configuration as well, the width of the trench is easily reduced. For example, the on-resistance is easily reduced. For example, the loss due to the current flowing through the parasitic bipolar transistor when avalanche breakdown occurs can be suppressed. According to the second embodiment, a semiconductor device can be provided in which the characteristics can be improved.

Figure 7:
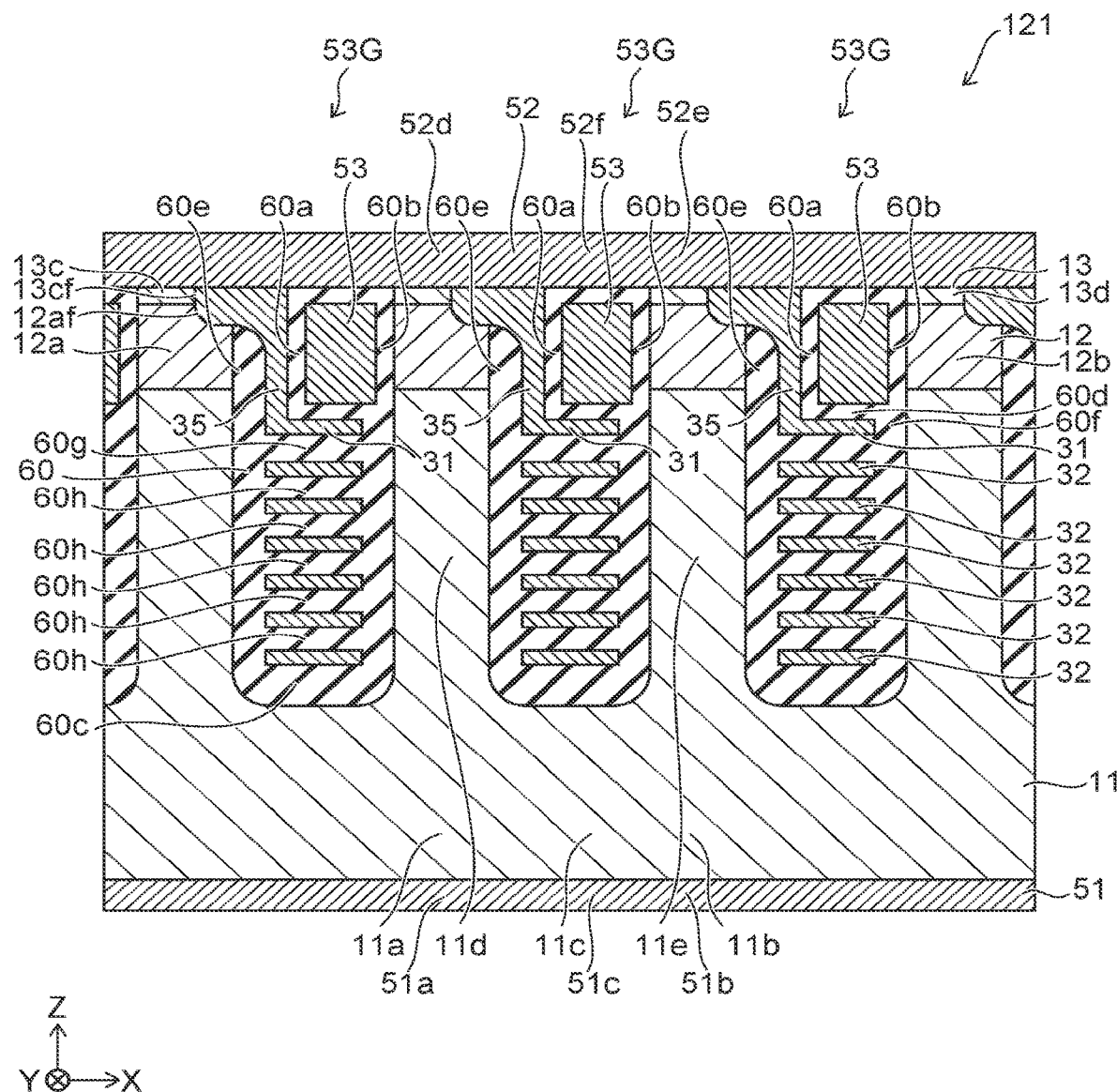
FIG. 7 is a schematic cross-sectional view illustrating a semiconductor device according to the second embodiment.

FIG. 7 is a schematic cross-sectional view illustrating a semiconductor device according to the second embodiment.

As shown in FIG. 7, the multiple structure bodies 53G are provided in the semiconductor device 121. One of the multiple structure bodies 53G includes the third electrode 53, the first conductive member 31, and the connection member 35. The multiple structure bodies 53G are arranged in the X-axis direction. One of the multiple structure bodies 53G corresponds to one trench region.

In the semiconductor device 121, the length along the X-axis direction of one of the multiple structure bodies 53G is easily reduced. For example, the distance (the width) along the X-axis direction of the region between the multiple structure bodies 53G is easily reduced. The surface area of the carrier region per unit area is easily increased. A low on-resistance is easily obtained thereby.

According to the embodiments, a semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, electrodes, conductive members, conductive layers, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode including a first electrode region, a second electrode region, and a third electrode region;
a second electrode, a direction from the first electrode toward the second electrode being along a first direction, a direction from the first electrode region toward the second electrode region being along a second direction crossing the first direction, the third electrode region being between the first electrode region and the second electrode region, the second electrode including a fourth electrode region, a fifth electrode region, and a sixth electrode region, a direction from the first electrode region toward the fourth electrode region being along the first direction, a direction from the second electrode region toward the fifth electrode region being along the first direction, a direction from the third electrode region toward the sixth electrode region being along the first direction;

a first semiconductor member including a first partial region, a second partial region, a third partial region, a fourth partial region, and a fifth partial region, the first semiconductor member being of a first conductivity type, the first partial region being between the first electrode region and the fourth electrode region in the first direction, the second partial region being between the second electrode region and the fifth electrode region in the first direction, the third partial region being between the third electrode region and the sixth electrode region in the first direction, the fourth partial region being between the first partial region and the fourth electrode region in the first direction, the fifth partial region being between the second partial region and the fifth electrode region in the first direction;

a second semiconductor member including a first semiconductor region and a second semiconductor region, the second semiconductor member being of a second conductivity type, the first semiconductor region being between the fourth partial region and the fourth electrode region in the first direction, the second semiconductor region being between the fifth partial region and the fifth electrode region in the first direction;

a third semiconductor member including a third semiconductor region and a fourth semiconductor region, the third semiconductor member being of the first conductivity type, the third semiconductor region being between the first semiconductor region and the fourth electrode region in the first direction, the fourth semiconductor region being between the second semiconductor region and the fifth electrode region in the first direction;

a third electrode provided between the third partial region and the sixth electrode region in the first direction, at least a portion of the third electrode being between the first semiconductor region and the second semiconductor region and between the third semiconductor region and the fourth semiconductor region;

a first conductive member, at least a portion of the first conductive member being between the third partial region and the third electrode in the first direction and between the fourth partial region and the fifth partial region in the second direction;

a connection member electrically connected to the first conductive member and the second electrode, at least a portion of the connection member being between the first semiconductor region and the third electrode; and an insulating member including a first portion, a second portion, a third portion, a fourth portion, and a fifth portion, the first portion being between the connection member and the third electrode, the second portion being between the third electrode and the second semiconductor region, the third portion being between the first partial region and the first conductive member, the fourth portion being between the first conductive member and the third electrode, the fifth portion being between the first semiconductor region and the connection member, the fifth portion contacting the first semiconductor region and the connection member.

2. The device according to claim 1, wherein
the second electrode further includes a seventh electrode region,
a portion of the seventh electrode region is between the first semiconductor region and the first portion, and
an other portion of the seventh electrode region is between the third semiconductor region and a portion of the third electrode.

3. The device according to claim 2, wherein
the portion of the seventh electrode region contacts the first semiconductor region, and
the other portion of the seventh electrode region contacts the third semiconductor region.

4. The device according to claim 2, wherein
a portion of the first semiconductor region is between the fourth partial region and the seventh electrode region in the first direction.

5. The device according to claim 2, wherein
the first semiconductor region includes a first surface facing the seventh electrode region, and
the first surface is oblique to the first and second directions.

6. The device according to claim 2, wherein
the third semiconductor region includes a third surface facing the seventh electrode region, and
the third surface is oblique to the first and second directions.

7. The device according to claim 1, wherein
a portion of the connection member is between the first semiconductor region and the first portion, and
an other portion of the connection member is between the third semiconductor region and a portion of the third electrode.

8. The device according to claim 7, wherein
the portion of the connection member contacts the first semiconductor region, and
the other portion of the connection member contacts the third semiconductor region.

9. The device according to claim 1, wherein
the first portion contacts the connection member and the third electrode, and
the second portion contacts the third electrode and the second semiconductor region.

10. The device according to claim 1, wherein
the insulating member includes a sixth portion,
the sixth portion is between the first conductive member and the fifth partial region, and
a direction from the sixth portion toward a portion of the third electrode is along the first direction.

11. The device according to claim 1, wherein
a length along a third direction of the connection member is greater than a length along the first direction of the connection member, and
the third direction crosses a plane including the first and second directions.

12. The device according to claim 1, further comprising:
one or a plurality of conductive layers,
the conductive layer being between the third portion and the first conductive member in the first direction,
the insulating member including a seventh portion,
the seventh portion being between the conductive layer and the first conductive member,
a potential of the conductive layer being in a floating state.

13. The device according to claim 12, comprising:
a plurality of the conductive layers,
the plurality of conductive layers being arranged along the first direction,
the insulating member including an eighth portion,
the eighth portion being between the plurality of conductive layers.

14. The device according to claim 13, wherein
the plurality of conductive layers includes a first conductive layer and a second conductive layer,
the second conductive layer is between the first conductive layer and the first conductive member, and a length along the second direction of the first conductive layer is greater than a length along the second direction of the second conductive layer.

15. The device according to claim 14, wherein
the plurality of conductive layers further includes a third conductive layer,
the third conductive layer is between the first conductive layer and the second conductive layer, and
a length along the second direction of the third conductive layer is between the length along the second direction of the first conductive layer and the length along the second direction of the second conductive layer.

16. The device according to claim 15, wherein
the plurality of conductive layers further includes a fourth conductive layer,
the fourth conductive layer is between the third conductive layer and the second conductive layer,
the third conductive layer is next to the first conductive layer,
the fourth conductive layer is next to the second conductive layer, and
a distance along the first direction between the first conductive layer and the third conductive layer is greater than a distance along the first direction between the fourth conductive layer and the second conductive layer.

17. The device according to claim 13, wherein
the plurality of conductive layers includes a first conductive layer, a second conductive layer, a third conductive layer, and a fourth conductive layer,
the second conductive layer is between the first conductive layer and the first conductive member,
the third conductive layer is between the first conductive layer and the second conductive layer and next to the first conductive layer,
the fourth conductive layer is between the third conductive layer and the second conductive layer and next to the second conductive layer, and
a distance along the first direction between the first conductive layer and the third conductive layer is greater than a distance along the first direction between the fourth conductive layer and the second conductive layer.

* * * * *